(12) United States Patent
Buchmann et al.

(10) Patent No.: US 6,876,226 B2
(45) Date of Patent: Apr. 5, 2005

(54) INTEGRATED DIGITAL CIRCUIT

(75) Inventors: Michael Buchmann, Duisburg (DE); Dirk Uffmann, Haltern am See (DE)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/372,721

(22) Filed: Feb. 24, 2003

(65) Prior Publication Data

US 2004/0164764 A1 Aug. 26, 2004

(51) Int. Cl.$^7$ .......................................... H03K 19/173
(52) U.S. Cl. ............................ 326/37; 326/47; 326/102; 326/103
(58) Field of Search ............................. 326/37, 47, 41, 326/101, 102, 103

(56) References Cited

U.S. PATENT DOCUMENTS

| | | | |
|---|---|---|---|
| 5,434,811 A | | 7/1995 | Evans, Jr. et al. |
| 5,923,184 A | * | 7/1999 | Ooms et al. ................. 326/50 |
| 6,233,169 B1 | | 5/2001 | Nishimura |
| 6,314,016 B1 | * | 11/2001 | Takasu ....................... 365/145 |
| 6,710,624 B2 | * | 3/2004 | Lienau ........................ 326/40 |

FOREIGN PATENT DOCUMENTS

| | | |
|---|---|---|
| EP | 0 415 221 | 3/1991 |
| GB | 2 315 348 | 1/1998 |
| JP | 8-180671 | 7/1996 |
| JP | 2000077986 | 3/2000 |
| JP | 2002269969 | 9/2002 |

* cited by examiner

*Primary Examiner*—Anh Q. Tran
(74) *Attorney, Agent, or Firm*—Alfred A. Fressola; Ware, Fressola, Van Der Sluys & Adolphson LLP

(57) ABSTRACT

The invention relates to an integrated digital circuit comprising a logic circuit portion which takes one of at least two different logic states in accordance with provided control signals. In order to minimize the power consumption and to enable a fast start up of the circuit resuming the previous states, it is proposed that it further comprises a non-volatile storage component. The non-volatile storage component takes one of at least two different logic states based on a non-destructive programming, and keeps a programmed logic state for a basically unlimited time and independently of a power supply until a new programming occurs, and is programmed by each change of the logic state of the logic circuit portion. The invention relates equally to a device comprising such a digital circuit and to a method of operating such a digital circuit.

6 Claims, 4 Drawing Sheets

INTEGRATED DIGITAL CIRCUIT

FIELD OF THE INVENTION

The invention relates to the field of digital design in microelectronics. More specifically, the invention relates to an integrated digital circuit comprising a logic circuit portion which takes one of at least two different logic states in accordance with provided control signals. The invention relates equally to a device comprising such an integrated digital circuit and to a method of operating such a digital circuit.

BACKGROUND OF THE INVENTION

Integrated digital circuits comprising logic circuit portions which are able to take one of at least two different logic states are well known from the state of the art, e.g. in form of conventional static complementary metal-oxide semiconductor (SCMOS) circuits. The status of such a logic circuit portion can be represented for example by flip-flops and latches realized by means of CMOS transistors.

For illustration, FIG. 1 shows a conventional CMOS latch, which is part of a digital circuit and which is able to take one of two different logic states.

The CMOS latch of FIG. 1 comprises two p-channel enhancement MOSFETs (metal-oxide semiconductor field-effect transistors) $T_{11}$, $T_{13}$ and two n-channel enhancement MOSFETs $T_{12}$, $T_{14}$. The source of the first p-channel MOSFET $T_{11}$ is connected to a power supply Vdd. The drain of the first p-channel MOSFET $T_{11}$ is connected to the drain of the first n-channel MOSFET $T_{12}$. The source of the first n-channel MOSFET $T_{12}$ is connected to ground Gnd. The second p-channel MOSFET $T_{13}$ and the second n-channel MOSFET $T_{14}$ are arranged in exactly the same way between the power supply Vdd and ground Gnd. The gate of the first p-channel MOSFET $T_{11}$ and the gate of the first n-channel MOSFET $T_{12}$ are connected on the one hand to a clocked input "in" and on the other hand to the connection between the second p-channel MOSFET $T_{13}$ and the second n-channel MOSFET $T_{14}$. The clocking is represented in FIG. 1 by a switch clk. The connection between the first p-channel MOSFET $T_{11}$ and the first n-channel MOSFET $T_{12}$ is connected on the one hand to an output "out" of the CMOS latch and on the other hand to the gate of the second p-channel MOSFET $T_{13}$ and the gate of the second n-channel MOSFET $T_{14}$.

When a low input voltage is provided to the input "in" of the CMOS latch, the first p-channel MOSFET $T_{11}$ is conducting while the first n-channel MOSFET $T_{12}$ is blocking. As a result, the output voltage at the output "out" is high, which high output voltage represents a first status of the logic circuit portion. When a high input voltage is provided to the input "in" of the CMOS latch, the first n-channel MOSFET $T_{12}$ is conductive and the first p-channel MOSFET $T_{11}$ is blocking. As a result, the output voltage at the output "out" is low, which low output voltage represents a second status of the logic circuit portion. The input signal is clocked in order to enable a synchronous operation of the digital circuit. As long as power is supplied by power source Vdd to the CMOS latch, the second p-channel MOSFET $T_{13}$ and the second n-channel MOSFET $T_{14}$ keep up the current status of the CMOS latch, until a new input voltage is provided.

All digital circuit technologies which are known today are volatile, which means that the states of the circuit are lost when the power supply is switched off completely.

In classical applications, three operation modes are therefore provided for digital circuits, namely running, stand-by and off.

In the off mode, the power is switched off completely. When proceeding from the off mode, the circuit has to go through an initialization phase, a so called boot procedure, after the power has been switched on, in order to reach a state in the running mode from which the circuit can start to work. This boot procedure requires time and power.

In the stand-by mode, the power is not switched off completely, possibly not even for inactive parts. The stand-by mode is provided in order to preserve the latest states of the digital circuit, when a device comprising the circuit is not used actively for some time.

It is a disadvantage of the stand-by mode that the transition from the running mode to the stand-by mode and back is a complex task, which equally requires time and power. It is moreover a disadvantage of the stand-by mode that a DC leakage current will flow, even if no clock is supplied. These leakage currents grow larger with each process technology generation because of the threshold voltage scaling. Leakage currents made up about 1% of the total power 10 years ago, when gates of 2 μm length were employed. The amount of the leakage current depends exponentially on the threshold voltage and increases with a factor of about five with each generation, as mentioned by Shekhar Borkar (Intel) in: "Design Challenges of Technology Scaling" IEEE 1999. Today, leakage reduction techniques are already needed.

Various concepts have been proposed to overcome the problems of the leakage current in the stand-by modes. All suffer from power requirement during the stand-by mode as well as from complicated enter and exit stand-by procedures.

In the area of storage, the problem is solved by making use in addition of non-volatile storage technologies, like FLASH memories. FLASH memories can be used to store the states of the entire digital circuit before shutting the power down completely. This operation is also called "suspend to FLASH". To exit the power-down mode, the status information is reloaded from the memory into the digital circuit, e.g. into comprised flip-flops and latches. Thereafter, the digital circuit is ready for operation with the same states as before the off mode. However, also for this saving of states for an off mode significant time and power is needed. The optimal trade-off between power saving by power down time and power consumption by programming and loading the FLASH memory is difficult to find.

Moreover, none of the known approaches solves the problem of a sudden power failure. That is, in case of a sudden power failure, the current states of the digital circuit are lost.

SUMMARY OF THE INVENTION

It is an object of the invention to reduce the power consumption of an integrated digital circuit.

It is further an object of the invention to accelerate the transition of an integrated digital circuit into a running mode resuming the previous states of the digital circuit.

It is further an object of the invention to avoid the loss of the current states of an integrated digital circuit in case of a sudden power failure.

An integrated digital circuit is proposed which comprises a logic circuit portion which takes one of at least two different logic states in accordance with provided control signals. In addition, the proposed integrated digital circuit comprises a non-volatile storage component. The non-volatile storage component takes one of at least two different logic states based on a non-destructive programming, and it keeps a programmed logic state for a basically unlimited time and independently of a power supply until a new programming occurs. The non-volatile storage component is programmed by and in accordance with each change of the logic state of the logic circuit portion.

It is to be noted that the non-volatile storage component can be a separate component of the integrated digital circuit which is connected to the logic circuit portion, while the logic circuit portion only takes one of at least two different logic states as long as power is provided to the logic circuit portion. Equally, however, the non-volatile storage component can be combined with the logic circuit portion to form a new type of logic circuit portion which has at the same time the qualities of a logic circuit portion and of a non-volatile storage component.

In addition, a device is proposed which includes the proposed integrated digital circuit.

Finally, a method of operating such an integrated digital circuit is proposed.

The invention proceeds from the idea that in an integrated digital circuit a non-volatile storage component can be added to a logic circuit portion for storing the status of the logic circuit portion with every change of this status. To this end, well-known concepts of conventional logic circuits can be combined with new materials, which are currently employed only for non-volatile memories. With the proposed combination, a completely new digital circuit technology is created which overcomes major problems that exist in all other circuit technologies available today by being super static (SSCMOS). Digital circuits using this invention will be static non-volatile, i.e. they will power up in the same state as in which it was switched off. This behavior is independent of the point of time at which the power is switched off. Thereby, new possibilities of realizing power saving modes and power fail save techniques are enabled.

It is an advantage of the invention that when the digital circuit is to be switched off, the power can be shut down without sacrificing time and energy for storing status information into separate non-volatile memories. When the power is switched on again, the digital circuit is ready for operation immediately, i.e. without a time consuming boot procedure. A user thus does not have to wait for the digital circuit to start up each time the power is switched on anew.

At the same time, the power can be switched off completely during a power down mode without loosing information. As a result, no leakage currents will flow. This will reduce the power consumption especially in deep sub micron technologies. Even in case of a sudden power failure, the current status is always stored in the non-volatile storage component.

Preferred embodiments of the invention become apparent from the dependent claims.

The logic circuit portion of the digital circuit according to the invention can be for instance a transistor based static CMOS circuit (SCMOS), which realizes e.g. at least one flip-flop and/or at least one latch.

The non-volatile storage component of the digital circuit according to the invention can be any kind of non-volatile storage element which allows a non-destructive reprogramming. The non-destructive programming of the non-volatile storage component can be based for example on changes in at least one of the following physical attributes of a material employed for the non-volatile storage component: the dielectric constant, the magnetic permeability, the crystal structure and the amorphous structure.

The non-volatile storage component can thus be for example a capacitor with a ferro-electric dielectricum or a magneto static element.

While ferro-electric and magneto static materials are well known, they have been considered so far exclusively for employment in the memory area, not for storage of a status of a digital circuit as in the presented invention. The materials are currently in use for special memory devices, as presented for instance on the web-site "http://www.ramtron.com/" and in "Motorola Sets Major Milestone with 1 Mbit MRAM Universal Memory Chip with Copper Interconnects", Press release Jun. 10, 2002, respectively.

Since the non-volatile storage element may come from current memory development, it can be small enough to be implemented into standard cell designs. Thus, no large area additions have to be made. Moreover, any control logic and memory which are normally needed for power-down enter and exit procedures can be avoided.

It is understood that the integrated digital circuit according to the invention may comprise many logic circuit portions which are able to assume one of at least two different states. Preferably, a dedicated non-volatile storage element is provided for each logic circuit portion of the digital circuit of which the status might be required after an off mode in which the power was switched off.

The invention can be employed for any integrated digital circuit that requires a power down mode. With the invention, for example, boot procedures of mobile devices can be shortened, thus accelerating their start up and saving power. In particular, micro processors can be frozen completely in every state. As a result, it will be possible, for example, to exchange the battery of a laptop computer without rebooting the operating system.

The implementation of the invention in a chip design does not require a new design style or flow. Rather, actual design flows for digital designs can be used by simply adding another library with the proposed combination of a logic circuit portion and a non-volatile storage component. For the physical implementation, a manufacturing process is required which integrates the non-volatile storage materials and the logic circuit portion.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE INVENTION

Figure 1:
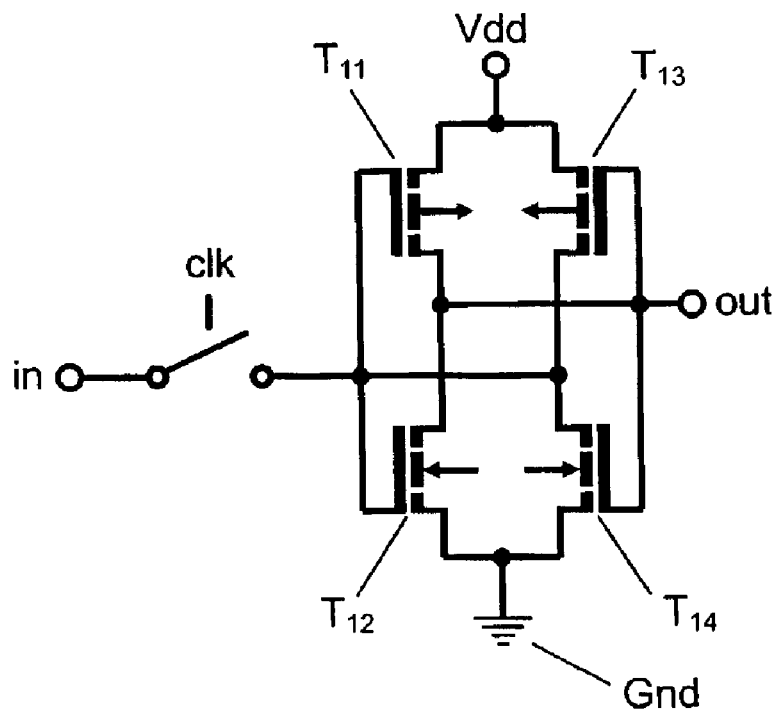
FIG. 1 presents a part of a known integrated digital circuit.

FIG. 1 has already been described above.

Figure 2:
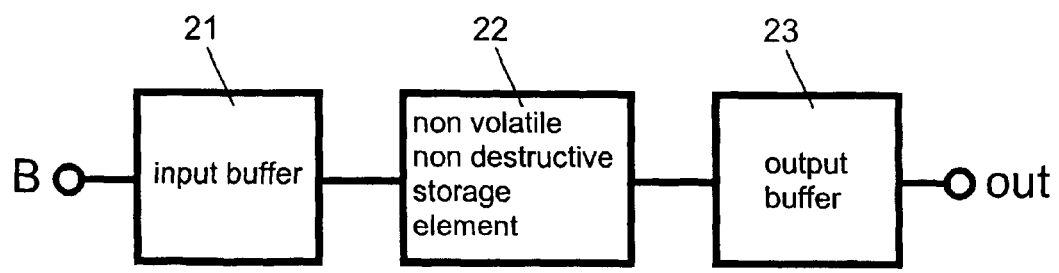
FIG. 2 presents a first embodiment of a part of an integrated digital circuit according to the invention.

FIG. 2 is a block diagram which illustrates a part of a first embodiment of the integrated digital circuit according to the invention in a general manner.

The circuit of FIG. 2 comprises an input buffer 21. The input of the input buffer 21 constitutes at the same time the input of the presented circuit. The output of the input buffer 21 is connected to the input of a non-volatile storage element 22, which can be programmed in a non-destructive manner. The output of the non-volatile storage element 22 is connected to an input of an output buffer 23. The output of the output buffer 23 constitutes at the same time the output of the presented circuit. The input buffer 21 and the output buffer 23 form a logic circuit portion which takes one of at least two different logic states in accordance with provided control signals.

When an input signal 'B' is applied to the circuit of FIG. 2, the input buffer 21 buffers a state represented by the input signal 'B' as long as power is supplied to the input buffer 21 and as long as no other input signal 'B' is applied. The buffered state is programmed automatically and immediately into the non-volatile storage element 22, which provides a corresponding signal to the output buffer 23. Also the output buffer 23 buffers the state corresponding to the signal from the non-volatile storage element 22 as long as power is supplied to the output buffer 21 and as long as no other signal is received. The output buffer 21 provides a signal corresponding to the buffered state as output signal 'out'.

When the power supply to the circuit is switched off, the buffered states of the buffers 21, 23 are lost. But the non-volatile storage element 22 stores the programmed state independently of power supply. When the power supply is switched on again, the output buffer 23 will therefore receive from the non-volatile storage element 22 immediately a signal corresponding to the previously buffered state again. As a result, the output buffer 23 is immediately able to provide the output signal 'out' again which was output before the power was switched off.

Figure 3:
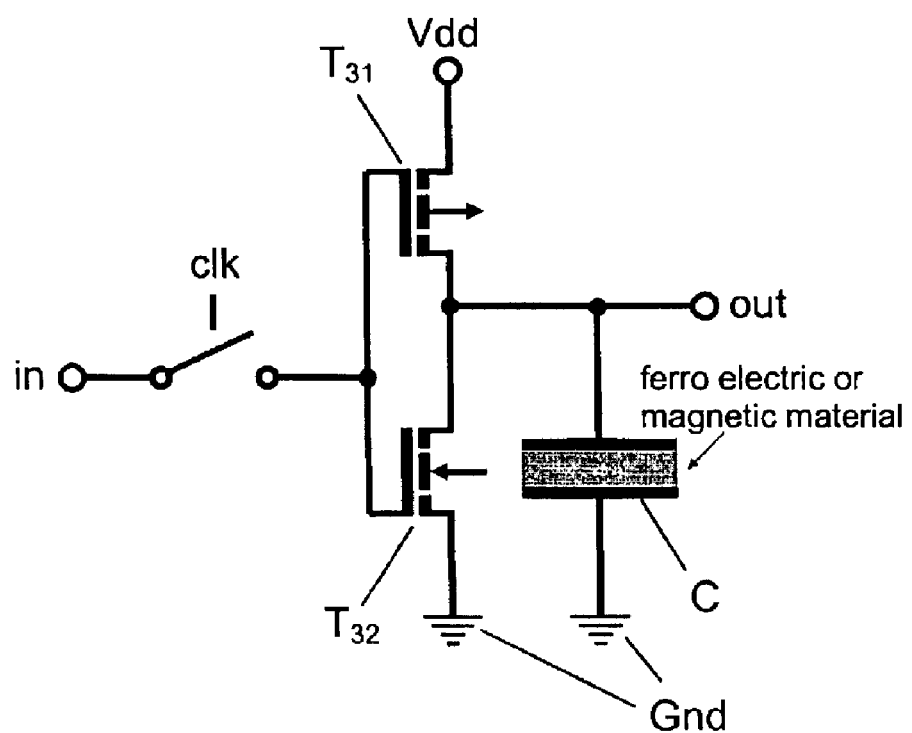
FIG. 3 presents a more specific realization of the embodiment of FIG. 2.

FIG. 3 illustrates by way of example a modified CMOS latch as one of several possibilities of realizing the circuit of FIG. 2. The modified CMOS latch proceeds from the CMOS latch of FIG. 1.

The CMOS latch of FIG. 3 comprises an p-channel enhancement MOSFET $T_{31}$ and a n-channel enhancement MOSFET $T_{32}$. The source of the p-channel MOSFET $T_{31}$ is connected to a power supply Vdd. The drain of the p-channel MOSFET $T_{31}$ is connected to the drain of the n-channel MOSFET $T_{32}$. The source of the n-channel MOSFET $T_{32}$ is connected to ground Gnd.

The gate of the p-channel MOSFET $T_3$, and the gate of the n-channel MOSFET $T_{32}$ are connected to a clocked input "in". The clocking is represented by a switch clk arranged between the input "in" and the gates. The connection between the p-channel MOSFET $T_3$, and the n-channel MOSFET $T_{32}$ is connected to an output "out" of the CMOS latch.

MOSFETs $T_{31}$ and $T_{32}$ constitute in this embodiment the logic circuit portion of the integrated digital circuit according to the invention.

In contrast to the circuit of FIG. 1, there is no second pair of CMOS transistors provided. Instead, a non-volatile storage element C is arranged between the connection between the p-channel MOSFET $T_{31}$ and the n-channel MOSFET $T_{32}$ on the one hand and ground Gnd on the other hand. The non-volatile storage element C is a capacitor with a ferro electric dielectricum or a magneto static element.

The basic function of the circuit of FIG. 3 is the same as the basic function of the circuit of FIG. 1. That is, when a low input voltage is provided to the input "in" of the CMOS latch, the p-channel MOSFET $T_{31}$ is conductive while the n-channel MOSFET $T_{32}$ is blocking. As a result, the output voltage at the output "out" is high. When a high input voltage is provided to the input "in" of the CMOS latch, the n-channel MOSFET $T_{32}$ is conductive while the p-channel MOSFET $T_{31}$ is blocking. As a result, the output voltage at the output "out" is low.

In contrast to the circuit of FIG. 1, the respective status of the transistor arrangement is stored immediately in the non-volatile storage element C, since this storage element C is connected to the output "out" of the CMOS latch. The output voltage is used more specifically for programming the non-volatile storage element C, the programming of a non-volatile storage element by applying a voltage per se being well known. The programming of a ferro-electric material is described for instance in the above cited web-site "http://www.ramtron.com/".

The non-volatile storage element C will store the current logic status for an unlimited time and independently of power supply Vdd, as long as no reprogramming occurs. Thus, the digital circuit can be stopped and even be powered down after each clock cycle without loosing information. When the digital circuit is powered up again, the status of the CMOS latch is immediately available at the output "out", since the status is made available by the non-volatile storage element C.

No control logic and no memory are required for power-down enter- and exit procedures.

Figure 4:
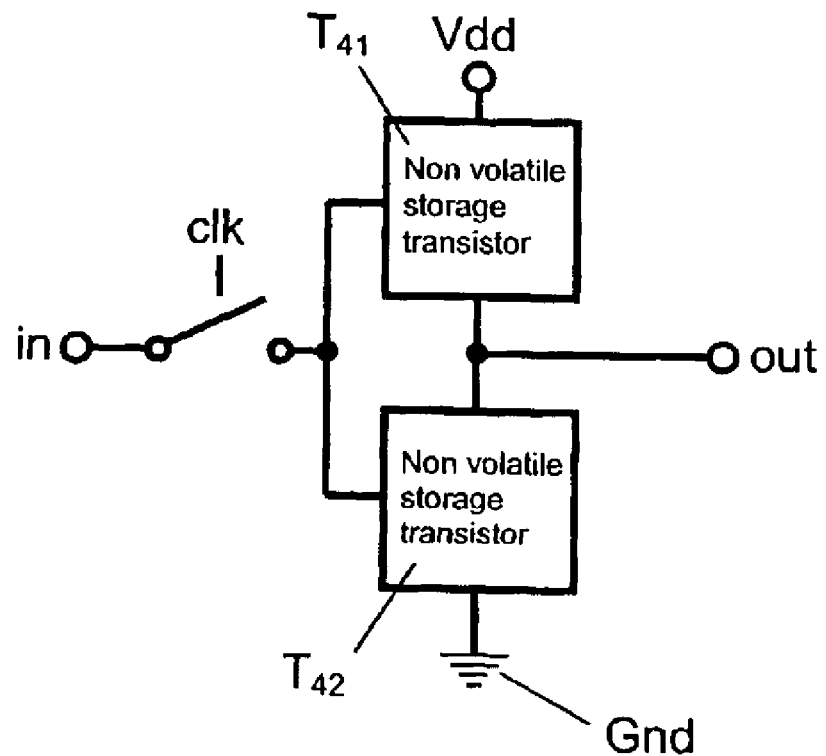
FIG. 4 presents a second embodiment of a part of an integrated digital circuit according to the invention.

FIG. 4 illustrates another modified CMOS latch as part of a second embodiment of an integrated digital circuit according to the invention.

Like the circuit of FIG. 3, the circuit of FIG. 4 comprises a pair of CMOS transistors $T_{41}$, $T_{42}$, which is arranged between a voltage supply Vdd and ground Gnd and which is connected to a clocked input "in" and to an output "out". The clocking is represented again by a switch clk arranged between the input "in" and the gates of the transistors $T_{41}$, $T_{42}$. Also the basic functions of the pair of CMOS transistors $T_{41}$, $T_{42}$ for providing a high and a low output voltage at output "out" is the same as in the embodiment presented in FIG. 2. MOSFETs $T_{41}$ and $T_{42}$ thus constitute in this embodiment the logic circuit portion of the integrated digital circuit according to the invention.

In this second embodiment, however, a non-volatile storage component is integrated directly into the transistors $T_{41}$, $T_{42}$. This leads to bi-stable transistors $T_{41}$, $T_{42}$ which are usable as a storage element and as a functional switch at the same time. The transistors $T_{41}$, $T_{42}$ themselves thus store directly the respective status of the CMOS latch in a non-volatile manner. Thereby, the same advantages can be achieved as with the first embodiment presented in FIG. 3.

It is understood that other switching elements than transistors could be used as well in both presented embodiments of an integrated digital circuit according to the invention.

While there have shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An integrated digital circuit comprising:
   a logic circuit portion which takes one of at least two different logic states in accordance with provided control signals; and
   a non-volatile storage component, which non-volatile storage component takes one of at least two different logic states based on a non-destructive programming, wherein the non-volatile storage component is fabricated from a material such that said non-destructive programming is based upon changes in the magnetic permeability of the non-volatile storage component, which non-volatile storage component keeps a programmed logic state for a basically unlimited time and independently of a power supply until a new programming occurs, and which non-volatile storage component is programmed by and in accordance with each change of the logic state of said logic circuit portion, wherein said non-volatile storage component is connected to said logic circuit portion, and wherein said logic circuit portion comprises a pair of complementary metal oxide semiconductor (CMOS) transistors connected to each other, an output of said logic circuit portion being provided at said connection between said CMOS transistors, and wherein said non-volatile storage component is connected to said output of said logic circuit portion.

2. An integrated digital circuit comprising:
   a logic circuit portion which takes one of at least two different logic states in accordance with provided control signals; and
   a non-volatile storage component, which non-volatile storage component takes one of at least two different logic states based on a non-destructive programming, wherein the non-volatile storage component is fabricated from a material such that said non-destructive programming is based upon changes in the magnetic permeability of the non-volatile storage component, which non-volatile storage component keeps a programmed logic state for a basically unlimited time and independently of a power supply until a new programming occurs, and which non-volatile storage component is programmed by and in accordance with each change of the logic state of said logic circuit portion, and wherein said logic circuit portion comprises at least one switching element and wherein said non-volatile storage component is integrated into said at least one switching element of said logic circuit portion.

3. The integrated digital circuit according to claim 2, wherein said logic circuit portion and said non-volatile storage component realize at least one of a flip-flop and a latch.

4. The integrated digital circuit according to claim 2, wherein said logic circuit portion is realized as a complementary metal oxide semiconductor (CMOS) circuit.

5. The integrated digital circuit according to claim 2, wherein said at least one switching element is at least one complementary metal oxide semiconductor (CMOS) transistor.

6. A device including an integrated digital circuit, which integrated digital circuit comprises:
   a logic circuit portion which takes one of at least two different logic states in accordance with provided control signals; and
   a non-volatile storage component, which non-volatile storage component takes one of at least two different logic states based on a non-destructive programming, wherein the non-volatile storage component is fabricated from a material such that said non-destructive programming is based upon changes in the magnetic permeability of the non-volatile storage component, which non-volatile storage component keeps a programmed logic state for a basically unlimited time and independently of a power supply until a new programming occurs, and which non-volatile storage component is programmed by and in accordance with each change of the logic state of said logic circuit portion, wherein said logic circuit portion comprises at least one switching element and wherein said non-volatile storage component is integrated into said at least one switching element of said logic circuit portion.

* * * * *